United States Patent [19]

Nakamura

[11] 4,425,557

[45] Jan. 10, 1984

[54] NON-CONTACT MAGNETIC POTENTIOMETER

[75] Inventor: Shigekazu Nakamura, Ageo, Japan

[73] Assignee: Copal Company Limited, Tokyo, Japan

[21] Appl. No.: 404,485

[22] Filed: Aug. 2, 1982

Related U.S. Application Data

[62] Division of Ser. No. 285,330, Jul. 22, 1981.

[30] Foreign Application Priority Data

| Jul. 25, 1980 [JP] | Japan | 55-101928 |
| Jul. 25, 1980 [JP] | Japan | 55-101929 |
| Jul. 25, 1980 [JP] | Japan | 55-101930 |

[51] Int. Cl.$^3$ .............................................. H01L 43/04
[52] U.S. Cl. ................................................... 338/32 H
[58] Field of Search ............................. 338/32 H, 32 R; 323/368; 324/251, 252

[56] References Cited

U.S. PATENT DOCUMENTS

| 3,162,804 | 12/1964 | Parsons | 323/368 |
| 3,304,530 | 2/1967 | Honig | 323/368 X |
| 3,671,854 | 6/1972 | Masuda | 338/32 H X |
| 3,671,874 | 6/1972 | Kobayashi | 388/32 HX |
| 3,777,273 | 12/1973 | Baba et al. | 338/32 H X |
| 3,900,814 | 8/1975 | Masuda | 338/32 R |
| 4,054,860 | 10/1977 | Henderson et al. | 338/32 H |

FOREIGN PATENT DOCUMENTS

| 2731661 | 1/1979 | Fed. Rep. of Germany | 338/32 R |
| 56-36177 | 4/1981 | Japan | 338/32 H |

Primary Examiner—C. L. Albritton
Attorney, Agent, or Firm—Cushman, Darby & Cushman

[57] ABSTRACT

A non-contact magnetic potentiometer comprising a rotatably supported first yoke, a second yoke arranged as opposed to the first yoke at a slight spacing, a pair of permanent magnets fixed as inclined on the surface of the first yoke opposed to the second yoke and magnetized in the thickness direction, and a Hall effect device fixed on the second yoke as opposed to the pair of permanent magnets, whereby the structure and manufacture can be simplified and an output voltage of any desired wave form can be obtained. This potentiometer is provided with a means for preventing the influences of the temperature and the variation with the lapse of years.

12 Claims, 10 Drawing Figures

NON-CONTACT MAGNETIC POTENTIOMETER

This application is a divisional of my copending application Ser. No. 285,330 filed July 22, 1981.

BACKGROUND OF THE INVENTION (a) Field of the Invention:

This invention relates to potentiometers and more particularly to improvements in a non-contact magnetic potentiometer using a Hall effect device.

(b) Description of the Prior Art:

Various non-contact magnetic potentiometers using Hall effect device are already suggested. For example, there is known a type wherein a Hall effect device is arranged near the periphery of a circular permanent magnet magnetized in the diametral direction so as to obtain a Hall electromotive force with the variation of the magnetic flux by the rotation of the circular permanent magnet or a type wherein a Hall effect device is arranged as opposed to a circular permanent magnet magnetized to have two poles in the rotating direction so as to obtain a Hall electromotive force with the variation of the magnetic flux when the circular permanent magnet is rotated.

In such magnetic potentiometer, for example, there are problems that the temperature coefficient of the Hall effect device is so large that the drift of the output voltage by the atmospheric temperature will be large and the variation width of the output voltage will become smaller with the time due to the variation of the permanent magnet with the lapse of years. Therefore, in this kind of magnetic potentiometer, measures must be taken to compensate the variation of the output voltage by the temperature variation and the variation with the lapse of time. For this purpose, there is already known a method wherein the variation of the output voltage by the temperature variation is canceled by utilizing the temperature characteristics of the permanent magnet and Hall effect device or a method wherein the temperature is compensated by utilizing a thermistor or the like as a temperature sensor. However, in such conventional method, as the compensation is made by utilizing the temperature characteristics of each temperature-sensitive element, due to the fluctuation of the temperature characteristics of the Hall effect device and temperature-sensitive element, no perfect compensation can be made. By the way, there is not yet suggested any effective compensating means for the variation with the lapse of time of the permanent magnet whose magnetic force reduces with the lapse of time.

SUMMARY OF THE INVENTION

Therefore, an object of the present invention is to provide a non-contact magnetic potentiometer wherein a plurality of Hall effect devices are set to obtain a plurality of electric signals different from each other in the phase, these electric signals are operated to control the Hall effect devices so that the temperature and the variation with the lapse of time can be effectively compensated.

This and other objects of the present invention will become more apparent during the course of the following detailed description and appended claims.

DESCRIPTION OF THE PREFERRED EMBODIMENTS

Figure 1:
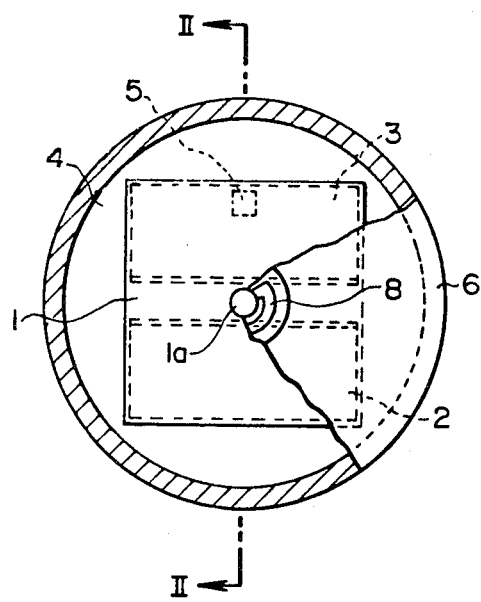
FIG. 1 is a partly sectioned plan view of an embodiment of a potentiometer according to the present invention.
Figure 2:
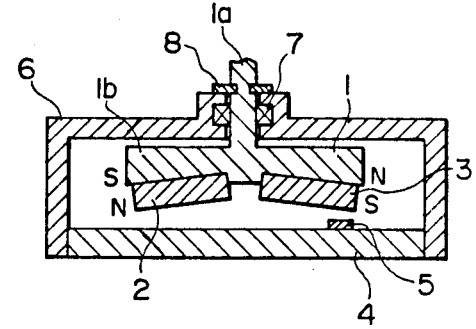
FIG. 2 is a sectional view on line II—II in FIG. 1.

First, in FIGS. 1 and 2, the reference numeral 1 denotes a first yoke having a shaft part 1a and square plate part 1b, 2 and 3 denote a pair of rectangular permanent magnets respectively magnetized in the thickness direction and arranged and secured to the lower surface of the plate part 1b symmetrically to each other with respect to the shaft part 1a as inclined so that different poles may be opposed to each other, 4 denotes a second yoke arranged in parallel with the plate part 1b so that a slight clearance may be formed from the magnets 2 and 3, 5 denotes a Hall effect device secured on the second yoke 4 so as to be able to be opposed to the outside magnetic poles of the magnets 2 and 3, 6 denotes a case having a bearing 7 for rotatably bearing the shaft part 1a and containing the plate part 1b and second yoke 4 and 8 denotes a washer fitted to the shaft part 1a so as to have the first yoke 1 supported with respect to the case 6 so that the plate part 1b and second yoke 4 may keep a predetermined distance between them.

As the potentiometer according to the present invention has the above mentioned formation, when the shaft part 1a of the first yoke 1 is rotated, an output corresponding to the angle of rotation of the shaft part 1a will be able to be taken out of the Hall effect device 5 by the mutual action of the magnetic fields formed by the magnets 2 and 3 and the Hall effect device 5.

Figure 3:
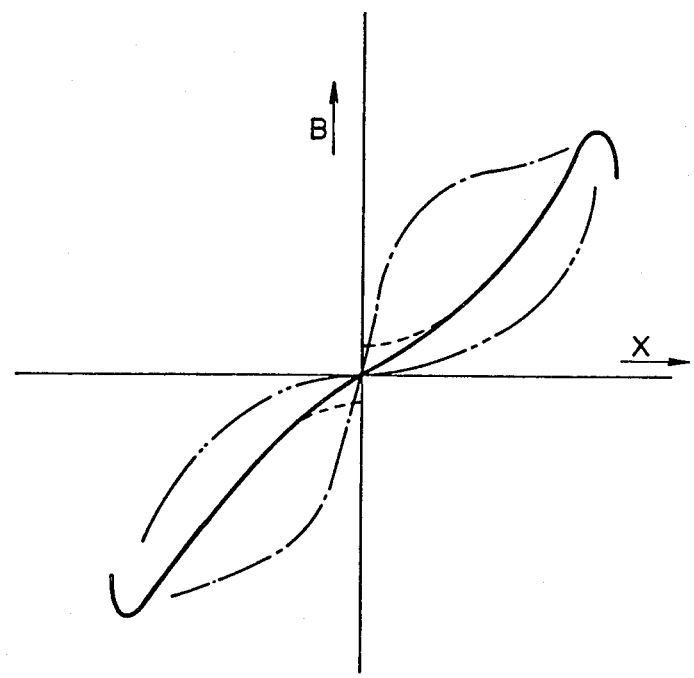
FIG. 3 is a characteristic diagram showing the magnetic flux distribution of a permanent magnet.

Generally, the Hall effect device puts out a Hall electromotive force proportional to the variation of the magnetic flux density which acts on the Hall effect device. In case such magnetic field generating means as a permanent magnet rotates in a plane parallel to the Hall effect device, for example, if the distribution of the magnetic flux density is so set that the intensity of the magnetic field may be uniform in the abscissa direction with the center of the shaft part 1a as an origin in FIG. 1 but may increase linearly on both plus and minus sides in the ordinate direction, the variation of the magnetic flux density which acts on the Hall effect device with the rotation of the magnetic field generating means will be represented as a trigonometric function having the rotation angle as a variable. Therefore, according to the present invention, the permanent magnets 2 and 3 are fitted as inclined to the plate part 1b so as to more approach the Hall effect device 5 as they separate along the ordinate from the origin. Also, generally, as the magnetic flux density B is substantially represented as a function of the ratio of the thickness of the permanent magnet to the distance between the permanent magnet and Hall effect device, if the variation of the value of the magnetic flux density B at a point located at a distance x along the ordinate from the origin in FIG. 1 is represented by the X-Y coordinates, it will be as shown in FIG. 3. That is to say, its characteristic curve varies with the distance between the magnet 2, 3 and Hall effect device 5 and the size of the angle of inclination of the magnets 2, 3 to the surface of the second yoke 4. For example, if the angle of inclination of the permanent magnet 2, 3 is small, the characteristic curve will be as shown by the one-point chain line in FIG. 3 and, in case the above mentioned angle of inclination is large, the characteristic curve will be as shown by the two-point chain line.

In the embodiment of the present invention, the above mentioned angle of inclination of the magnets 2, 3 is so selected as to have such characteristic curve as is shown by the solid line in FIG. 3. In this case, the characteristic curve of each of the magnets 2 and 3 is as shown by the broken line branching from the solid line near the origin of the coordinates but, as the permanent magnets 2 and 3 are close to each other with the shaft part 1a between them, by the mutual action of the magnetic fluxes both permanent magnets 2 and 3, in fact, the straight line passing through the origin can be approximated. In FIG. 1, as the magnetic flux density by the magnets 2, 3 along the ordinate can be linearly varied, the Hall electromotive force generated in the Hall effect device 5 by the rotation of the first yoke 1 can be taken out as of a wave form substantially close to a sine wave form.

By the way, as shown by the two-point chain line in FIG. 3, by properly selecting the distance between the angle of inclination of the permanent magnets 2, 3 and the Hall effect device 5, the Hall electromotive force can be taken out as of a triangular wave form.

Figure 4:
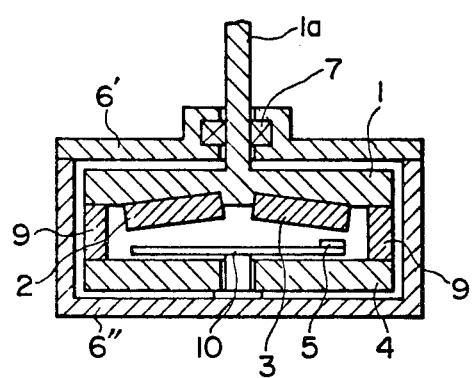
FIG. 4 is the same sectional view as FIG. 2 showing another embodiment of a potentiometer according to the present invention somewhat different from that in FIG. 1.

FIG. 4 shows another embodiment of the present invention. In this embodiment, the first yoke 1 and second yoke 4 are integrally connected with each other through members 9, 9 made of a nonmagnetic material so as to rotate integrally. Further, in respect that the case consists of two members 6' and 6" and the Hall effect device 5 is secured on a plate 10 supported by the member 6", this embodiment is different from the embodiment already described with reference to FIGS. 1 and 2. This embodiment is advantageous in respect that, as the permanent magnets 2 and and first and second yokes 1 and 4 rotate integrally, no eddy current will be generated in the second yoke 4.

Figure 5:
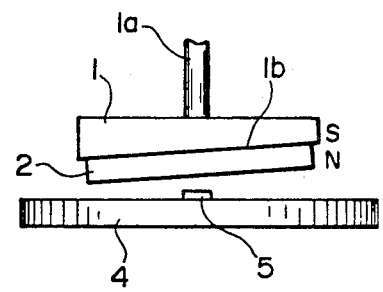
FIG. 5 is a side view of an essential part showing still another embodiment of a potentiometer according to the present invention.
Figure 6:
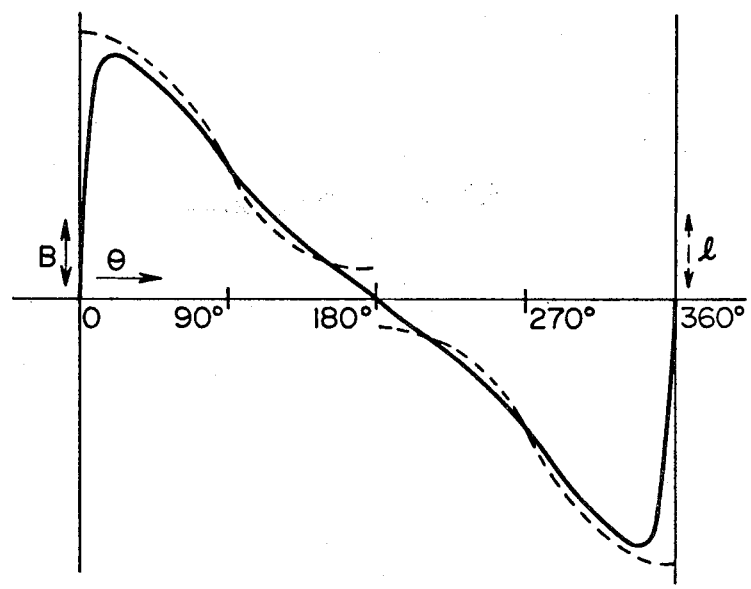
FIG. 6 is a characteristic diagram showing relations between the magnetic induction and clearance size for the rotation angle of the first yoke in the embodiment shown in FIG. 5.

FIG. 5 shows still another embodiment of the present invention. In respect that the first yoke is so formed that the lower surface of the first yoke 1 may simply incline to the upper surface and a pair of permanent magnets 2 and 3 are arranged and fixed as shown in FIG. 1 on the lower surface, this embodiment is different from the already explained embodiments. In this embodiment, while considering the polarity of the permanent magnets 2 and 3, the relation of the magnetic flux density B which acts on the Hall effect device 5 with the angle of rotation of the first yoke 1 is represented as shown in FIG. 6. In this case, in the vicinity in which the angle of rotation is 0, 180 and 360 degrees, the magnetic flux density B by each magnet 2, 3 varies discontinuously but both magnets 2 and 3 are arranged, in fact, so closely to each other that the magnetic flux density B can be considered to vary substantially linearly due to the mutual action of the magnetic fluxes as shown by the solid line in FIG. 6. As already described, the Hall effect device 5 puts out a Hall electromotive force proportional to the variation of the magnetic flux density. Therefore, in the case by this embodiment, an output voltage of such wave form as is shown by the solid line in FIG. 6, that is, an output voltage varying linearly over the substantially entire range of one rotation of the yoke 1 can be obtained from the Hall effect device 5. In other words, a substantially linearly varying Hall electromotive force is obtained in a range of 45 to 315 degrees of the angle $\theta$ of rotation. Therefore, in the case of this embodiment, there is an advantage that the effective electrical angle can be set in such wide range as 270 degrees.

Figure 7:
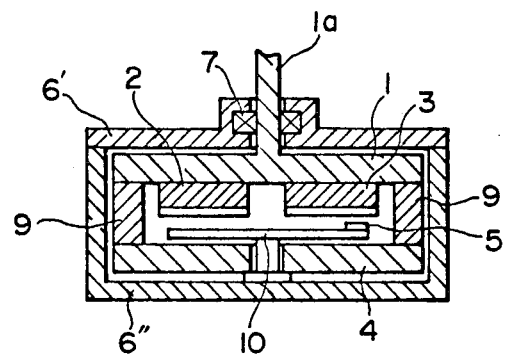
FIG. 7 is the same sectional view as FIG. 4 showing still another embodiment of the present invention somewhat different from the embodiment in FIG. 6.

FIG. 7 shows further another embodiment of the present invention. In respect that the first yoke 1 and second yoke 4 are integrally connected with each other through the members 9, 9 made of a nonmagnetic material and are integrally rotated and the Hall effect device 5 is secured on the plate 10 supported by the case member 6", this embodiment is different from the embodiment shown in FIG. 5. In this embodiment, there is an advantage that, as the permanent magnets 2 and 3 and the first and second yokes 1 and 4 rotate integrally, no eddy current will be generated in the second yoke 4.

In the above explained respective embodiments, the permanent magnets 2 and 3 are all rectangular but may be semicircular or triangular. Though any form of the permanent magnets 2 and 3 can be thus used, in any case, it is necessary that the permanent magnets should be magnetized in their thickness direction.

Figure 8:
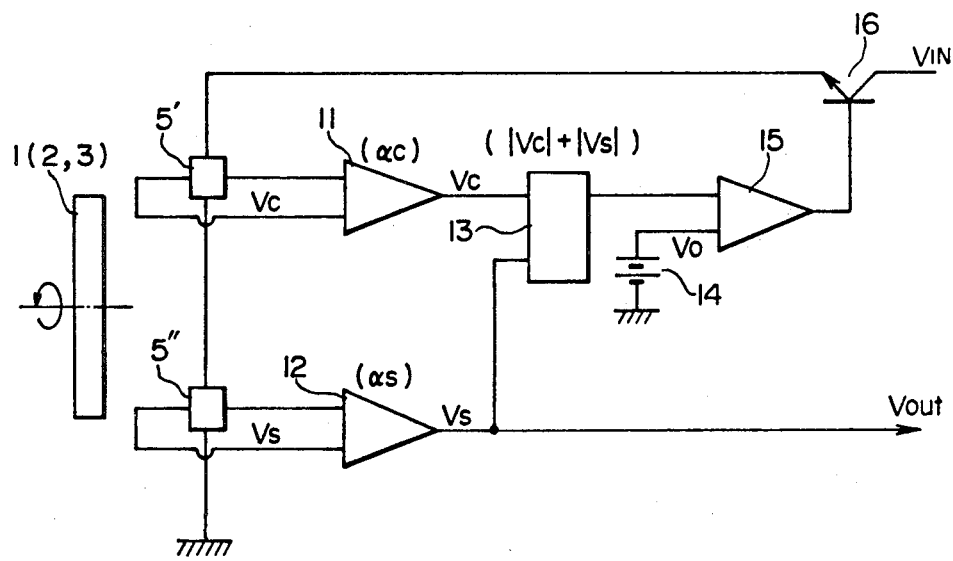
FIG. 8 is a block diagram showing an example of a compensating device for the temperature and the variation with the lapse of time as used for a potentiometer according to the present invention.

FIG. 8 shows an embodiment for compensating the temperature variations and the variations with the lapse of time of the permanent magnets 2 and 3 and Hall effect device 5 in each embodiment explained above.

First, in using two Hall effect device arranged as displaced by an electrical angle of 90 degrees, the principle of the compensating method shall be explained. If the output voltage of the Hall effect device is assumed for the sake of convenience to vary trigonometrically functionally with respect to the rotation angle $\theta$ of the rotary shaft 1a of the potentiometer, the output voltages $V_c$ and $V_s$ of two Hall effect device arranged as displaced by an electrical angle of 90 degrees from each other will be represented by $$\left. \begin{array}{l} V_c = K_c \, i \, B_o \cos\theta \\ V_s = K_s \, i \, B_o \sin\theta \end{array} \right\} \quad (1)$$

wherein symbols $K_c$ and $K_s$ denote Hall effect device product sensitivities, $B_o$ denotes a magnetic flux density and i denotes a device driving current. If the amplifying rates of amplifiers connected to the respective Hall effect device are $\alpha_c$ and $\alpha_s$, the output voltages $V_c$ and $V_s$ of the respective amplifiers will be $$V_c = \alpha_c K_c i B_o \cos\theta \atop V_s = \alpha_s K_s i B_o \sin\theta \Bigg\} \quad (2)$$

Therefore, the output voltages $V_c$ and $V_s$ of the respective Hall effect device will fluctuate with the temperature drift of the Hall effect device product sensitivities $K_c$ and $K_s$, the temperature drift of the magnetic flux density $B_o$ by the formula (1) and the variation with the lapse of years by the formula (1) and also the output voltages $V_c$ and $V_s$ of the respective amplifiers will fluctuate by the formula (2). Therefore, if the sum of the absolute values of the output votages $V_c$ and $V_s$ of the respective amplifiers is taken, the added voltage $V_o$ will be $$V_o = |V_s| + |V_c| \quad (3)$$
$$= iB_o\{\alpha_s K_s |\sin\theta| + \alpha_c K_c |\cos\theta|\}$$
$$i = \frac{V_o}{B_o\{\alpha_s K_s |\sin\theta| + \alpha_c K_c |\cos\theta|\}}$$

If the formula (3) is substituted in the formula (2), $$V_s = \frac{\alpha_s K_s \sin\theta}{\alpha_s K_s |\sin\theta| + \alpha_c K_c |\cos\theta|} V_o \quad (4)$$

will be made, the magnetic flux density $B_o$ will be eliminated and the influence by the temperature drift of the magnetomotive force of the permanent magnets or by the variation with the lapse of years will not appear.

Further, with respect to the temperature, the Hall effect device product sensitivities $K_c$ and $K_s$ are represented as $K_c = K_{co}(1+\beta T)$, $K_s = K_{so}(1+\beta T)$. Therefore, if this is substituted in the formula (4), $$V_s = \frac{\alpha_s K_{so}(1+\beta T)\sin\theta}{\alpha_s K_{so}(1+\beta T)|\sin\theta| + \alpha_c K_{co}(1+\beta T)|\cos\theta|} \quad (5)$$
$$= \frac{\alpha_s K_{so}\sin\theta}{\alpha_s K_{so}|\sin\theta| + \alpha_c K_{co}|\cos\theta|}$$

will be made. As $K_{so}$ and $K_{co}$ are constants, in the output voltage, the coefficient of the temperature drift and the coefficient of the variation with the lapse of years will be all eliminated. Therefore, when the added voltage $V_o$ of the absolute value is adjusted to be constant, an output signal of a potentiometer having no influence at all by the above mentioned temperature drift and the variation with the lapse of years will be able to be obtained.

Now, the explanation shall be concretely made with reference to FIG. 8. The reference numerals 5' and 5" denote Hall effect device arranged on the second yoke 4 in the position displaced in the phase by an electrical angle of 90 degrees with respect to the rotary shaft 1a and connected in series with respect to the current source line $V_{in}$. The reference numerals 11 and 12 denote amplifiers respectively for amplifying the Hall electromotive force of the Hall effect device 5' and 5" and the respective amplifying rates $\alpha_c$ and $\alpha_s$ are so adjusted that the output voltages $V_c$ and $V_s$ may be of $|V_c|_{max} = |V_s|_{max}$. The reference numeral 13 denotes an operating circuit into which the respective output voltages $V_c$ and $V_s$ of the amplifiers 11 and 12 are put and in which the absolute values of the output voltage $V_c$ and $V_s$ are added, 14 denotes a reference voltage source and 15 denotes a comparator in which the voltage $V_o$ of the reference voltage source 14 is compared with the output voltage of the operating circuit 13 and a signal corresponding to the difference is put out. The reference numeral 16 denotes a transistor which is operated by the output of the comparing circuit 15 and in which the emitter and collector are connected in series with respect to the current source $V_{in}$ of the Hall effect device 5' and 5" to form a controlling circuit for the Hall effect device 5' and 5".

The operation is as follows. When the first yoke 1 is rotated, Hall electromotive forces displaced from each other by 90 degrees in the phase will be generated in the respective Hall effect device and will be amplified by the amplifiers 11 and 12 and their absolute values will be added in the operating circuit 13. The comparator 15 will compare the output of the operating circuit 13 with the voltage $V_o$ of the reference voltage source 14, will impress a signal corresponding to the difference to the base of the transistor 16, will operate the transistor 16 to control the fed currents to the Hall effect device 5' and 5" and will operate so that the output voltage of the operating circuit 13 may coincide with the reference voltage $V_o$. Thus, as the amplifying rates $\alpha_c$ and $\alpha_s$ of the amplifiers 11 and 12 are so adjusted that the output voltages $V_c$ and $V_s$ may be of $|V_c|_{max} = |V_s|_{max}$, $\alpha_c K_c = \alpha_s K_s$. If this is substituted in the above mentioned formula (4), the output voltage $V_{out}$ of the potentiometer will be represented by $$V_{out} = V_s = \frac{\sin\theta}{|\sin\theta| + |\cos\theta|} V_o \quad (6)$$

Figure 9A:
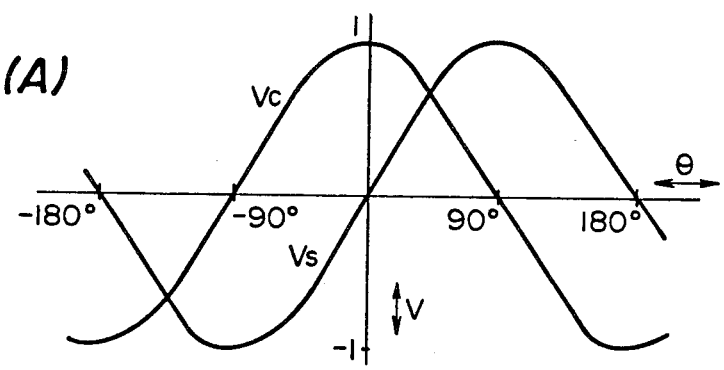
FIGS. 9A and 9B are views of voltage wave forms obtained by the compensating device shown in FIG. 8.
Figure 9B:
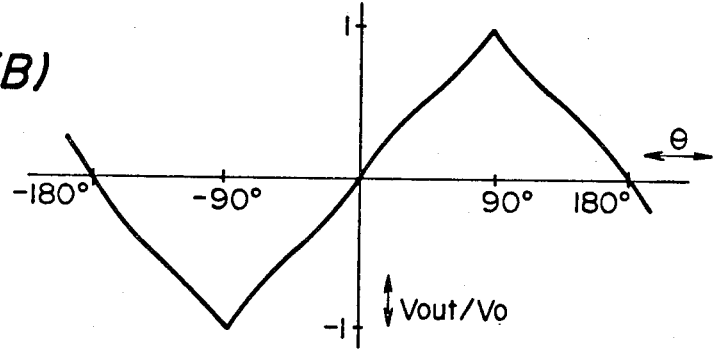

If the above mentioned formula (6) is illustrated, such sine wave form and cosine wave form as are shown in FIG. 9 (A) will be combined to form such substantially linear triangular wave form as is shown in FIG. 9 (B). Therefore, the output voltage $V_{out}$ of the potentiometer will have no influence of the temperature drift and the variation with the lapse of years as represented by the above described formula (5) and the wave form will be such triangular wave form as is show in FIG. 9 (B) by the formula (6).

By the way, the case of using a means of detecting the magnetic field distribution in which the output voltage of the Hall effect device varies trigonometrically functionally with respect to the angle of rotation of the rotary shaft 1a of the potentiometer has been explained in the above described principle and embodiments. However, for example, a means of detecting such magnetic field distribution in which the output of the Hall effect device is of triangular wave form can be used. According to such detecting means, as the output varies linearly, the output voltage wave form of the potentiometer will have no such rolling of the wave form as is shown in FIG. 9 (B) and an output wave form excellent in the linearity can be obtained. Further, in the above mentioned embodiments, there is explained the case that the Hall effect devices 5' and 5" are connected in series with respect to the current source $V_{in}$ to control the current. However, for example, the Hall effect device 5' and 5" may be modified to be connected in parallel with respect to the current source $V_{in}$ to control the voltage. In such case, for example, if two Hall effect devices of the same internal resistance are used, the same as is explained in the above described principle, the coefficients of the temperature and the variation with the lapse of time will be eliminated and a potentiometer not influenced by them will be able to be made.

I claim:

1. A non-contact magnetic potentiometer comprising:
a rotatable first yoke to which an angular displacement is to be transmitted,
a second yoke arranged as opposed to and spaced from said first yoke,
Hall effect means fixedly located in parallel with said second yoke between said first yoke and second yoke, and
a pair of permanent magnets magnetized in the thickness direction and secured as inclined to said Hall effect means on the first yoke surface opposed to said second yoke,
a Hall electromotive force corresponding to the angle of rotation of said first yoke being derived from said Hall effect means when said first yoke is rotated,
said Hall effect means including a pair of Hall effect devices arranged in positions displaced by an electrial angle of 90 degrees in the phase with respect to the axis of rotation of said first yoke,
operating means for adding the absolute values of the outputs of said pair of Hall effect devices, and
controlling circuit means for controlling said pair of Hall effect devices to make constant the value obtained from said operating means.

2. A potentiometer according to claim 1 wherein said pair of permanent magnets are arranged symmetrically with each other with respect to the axis of rotation of said first yoke and the sides facing said hole element means of said pair of permanent magnets have polarities reverse to each other.

3. A potentiometer according to claim 1 wherein said pair of permanent magnets are arranged as inclined in the same direction with each other to the plane intersecting at right angles with the axis of rotation of said first yoke and the sides facing said hole element means of said pair of permanent magnets have polarities reverse to each other.

4. A potentiometer according to claim 2 or 3 wherein said hole element means is secured on said second yoke.

5. A potentiometer according to claim 2 or 3 wherein said first yoke and second yoke are integrally connected with each other through connecting members made of a nonmagnetic material.

6. A non-contact magnetic potentiometer comprising:
a rotatable first yoke to which an angular displacement is to be transmitted,
a second yoke arranged as opposed to and spaced from said first yoke,
Hall effect means fixedly located in parallel with said second yoke between said first yoke and second yoke and including a pair of Hall effect devices arranged in the positions displaced by an electrical angle of 90 degrees in the phase with respect to the axis of rotation of said first yoke,
a pair of permanent magnets magnetized in the thickness direction and secured to said first yoke,
Hall electromotive forces being respectively outputted from said Hall effect devices in response to the angle of rotation of said first yoke when said first yoke is rotated,
means adjustable to equate the maximum value of one of the Hall electromotive forces from said Hall effect devices to the other maximum value,
operating means for adding the absolute values of the Hall electromotive forces from said Hall effect devices,
controlling circuit means for comparing the output from said operating means with a reference voltage, and
means for controlling the currents fed to said Hall effect devices on the basis of the output from said controlling circuit means to thereby make coincide the output from said operating means with said reference voltage.

7. A potentiometer according to claim 6 wherein said pair of permanent magnets are arranged symmetrically with each other with respect to the axis of rotation of said first yoke and the sides facing said Hall effect means of said pair of permanent magnets have polarities reverse to each other.

8. A potentiometer according to claim 6 wherein said pair of permanent magnets are arranged as inclined in the same direction with each other to the plane intersecting at right angles with the axis of rotation of said first yoke and the sides facing said Hall effect means of said pair of permanent magnets have polarities reverse to each other.

9. A potentiometer according to claim 7 or 8 wherein said Hall effect means is secured on said second yoke.

10. A potentiometer according to claim 7 or 8 wherein said first yoke and second yoke are integrally connected with each other through connecting members made of a nonmagnetic material.

11. A potentiometer according to claim 6 wherein said pair of permanent magnets are arranged as inclined to said Hall effect means.

12. A potentiometer according to claim 1 or 6 wherein said pair of permanent magnets are arranged in parallel with said Hall effect means.

* * * * *